(12) United States Patent
Zhao et al.

(10) Patent No.: US 10,361,289 B1
(45) Date of Patent: Jul. 23, 2019

(54) GATE OXIDE FORMATION THROUGH HYBRID METHODS OF THERMAL AND DEPOSITION PROCESSES AND METHOD FOR PRODUCING THE SAME

(71) Applicant: GLOBALFOUNDRIES Inc., Grand Cayman (KY)

(72) Inventors: Wei Zhao, Fort Lee, NJ (US); Shahab Siddiqui, Clifton Park, NY (US); Haiting Wang, Clifton Park, NY (US); Ting-Hsiang Hung, Clifton Park, NY (US); Yiheng Xu, Clifton Park, NY (US); Beth Baumert, Ballston Lake, NY (US); Jinping Liu, Ballston Lake, NY (US); Scott Beasor, Greenwich, NY (US); Yue Zhong, Ballston Lake, NY (US); Shesh Mani Pandey, Saratoga Springs, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 15/933,032

(22) Filed: Mar. 22, 2018

(51) Int. Cl.
*H01L 29/66* (2006.01)
*H01L 21/02* (2006.01)
*H01L 21/28* (2006.01)
*H01L 29/78* (2006.01)

(52) U.S. Cl.
CPC .... *H01L 29/66818* (2013.01); *H01L 21/0214* (2013.01); *H01L 21/0228* (2013.01); *H01L 21/02164* (2013.01); *H01L 21/02238* (2013.01); *H01L 21/02247* (2013.01); *H01L 21/02252* (2013.01); *H01L 21/02255* (2013.01); *H01L 21/02274* (2013.01); *H01L 21/28185* (2013.01); *H01L 21/28202* (2013.01); *H01L 29/66545* (2013.01); *H01L 29/7853* (2013.01)

(58) Field of Classification Search
CPC ......... H01L 29/66818; H01L 21/02247; H01L 21/02238; H01L 21/02164; H01L 21/02274
See application file for complete search history.

(56) References Cited

U.S. PATENT DOCUMENTS

| | | | |
|---|---|---|---|
| 5,360,769 A | 11/1994 | Thakur et al. | |
| 6,033,943 A | 3/2000 | Gardner | |
| 9,006,802 B2* | 4/2015 | Huang | H01L 21/02164 257/288 |
| 9,252,232 B2 | 2/2016 | Chudzik et al. | |
| 9,570,274 B2* | 2/2017 | Swaminathan | C23C 16/045 |
| 9,620,642 B2* | 4/2017 | Toh | H01L 29/785 |
| 9,691,765 B1* | 6/2017 | Bi | H01L 27/0886 |
| 10,008,414 B2* | 6/2018 | Ching | H01L 21/823431 |
| 2018/0090491 A1* | 3/2018 | Huang | H01L 21/76224 |
| 2018/0286663 A1* | 10/2018 | Kobayashi | H01L 21/0234 |

* cited by examiner

*Primary Examiner* — William Coleman
(74) *Attorney, Agent, or Firm* — Ditthavong & Steiner P.C.

(57) ABSTRACT

A method of thermally oxidizing a Si fin to form an oxide layer over the Si fin and then forming an ALD oxide layer over the oxide layer and resulting device are provided. Embodiments include forming a plurality of Si fins on a Si substrate; forming a dielectric layer over the plurality of Si fins and the Si substrate; recessing the dielectric layer, exposing a top portion of the plurality of Si fins; thermally oxidizing surface of the top portion of the plurality of Si fins, an oxide layer formed; and forming an ALD oxide layer over the oxide layer.

18 Claims, 5 Drawing Sheets

GATE OXIDE FORMATION THROUGH HYBRID METHODS OF THERMAL AND DEPOSITION PROCESSES AND METHOD FOR PRODUCING THE SAME

TECHNICAL FIELD

The present disclosure relates to the manufacture of semiconductor devices, such as integrated circuits (ICs). The present disclosure is particularly applicable to forming and shaping fin field-effect transistor (finFET) fins.

BACKGROUND

As ICs continue to decrease in size in pursuit of higher device density, higher performance, production efficiency and lowering associated costs, challenges from both fabrication and design issues have resulted in increased complexity of processing and manufacturing ICs. Conventional etching, e.g., reactive ion etching (ME), for manufacturing finFETs causes variation of fin critical dimensions (CDs) resulting in undesirable electrical properties.

Referring to FIG. 1 (a cross-sectional view), a silicon (Si) fin 101 (representing one of a plurality) is formed on a Si substrate 103. Then, a dielectric layer (not shown for illustrative convenience) is formed over the Si fin 101 and the Si substrate 103. Next, the dielectric layer is recessed, thereby exposing a top portion of the Si fin 101 above the remaining dielectric layer 105. Thereafter, an in situ steam generation (ISSG) oxidation is performed on the top portion of the Si fin 101. The ISSG oxidation grows an extended gate (EG) oxide layer 107 over the Si fin 101, which consequently thins the top portion of the Si fin 101. In this instance, the IS SG oxidation results in a CD delta between the top portion of the Si fin 101 and the bottom portion of the Si fin 101 buried under the dielectric layer 105. Since fin pitches are generally small, Si fins with bigger CDs are not properly formed during ME resulting in an embedded defect. In addition, ISSG oxide growth results in bulging of the CD of the Si fin 101 (highlighted by the circle 109), a thinner EG oxide at the foot of Si fin 101 and an uneven thickness of the EG oxide layer 107 over and on the sidewall of the Si fin 101.

A need therefore exists for methodology enabling smaller incoming fin CD with reduced bulging and thicker EG oxide at the foot of a Si fin, and a uniform EG oxide layer over and on the sidewall of the Si fin.

SUMMARY

An aspect of the present disclosure is a method for thermally oxidizing a Si fin to form an oxide layer over the Si fin and then forming an atomic layer deposition (ALD) oxide layer over the oxide layer.

Another aspect of the present disclosure is a device including an oxide layer over a Si fin and an ALD oxide layer over the oxide layer.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.

According to the present disclosure, some technical effects may be achieved in part by a method including: forming a plurality of Si fins on a Si substrate; forming a dielectric layer over the plurality of Si fins and the Si substrate; recessing the dielectric layer, exposing a top portion of the plurality of Si fins; thermally oxidizing surface of the top portion of the plurality of Si fins, an oxide layer formed; and forming an ALD oxide layer over the oxide layer.

Aspects of the present disclosure include forming the oxide layer to a thickness of 5 angstrom (Å) to 100 Å. Further aspects include forming the ALD oxide layer by a remote oxygen plasma process. Another aspect includes the remote oxygen plasma process performed at a temperature of 400° C. to 425° C. Additional aspects include forming the ALD oxide layer to a thickness of 5 Å to 100 Å. Further aspects include performing a plasma oxidation process using a radio frequency (RF) or a microwave plasma at a room temperature to up to 450° C.; and performing a plasma nitridation process subsequent to forming the ALD oxide layer. Additional aspects include performing a plasma nitridation process using a RF or a microwave plasma at a room temperature to up to 450° C. subsequent to forming the ALD oxide layer. Further aspects include performing a nitrous oxide ($N_2O$)/helium (He) or similar inert carry gases based high temperature annealing; and performing a plasma nitridation process and/or a high temperature anneal subsequent to forming the ALD oxide layer. Another aspect includes performing the high temperature annealing at a temperature of 600° C. to 1100° C. Additional aspects include performing a plasma nitridation process on the oxide layer and the ALD oxide layer; and annealing the oxide layer and the ALD oxide layer at a temperature of 600° C. to 1100° C.

Another aspect of the present disclosure is a device including: a plurality of Si fins having a top portion and a bottom portion on a Si substrate; a dielectric layer over the Si substrate and along sidewalls of the bottom portion of the plurality of Si fins; an oxide layer over and along sidewalls of the top portion of the plurality of Si fins; and an ALD oxide layer over the oxide layer.

Aspects of the device include the oxide layer having a thickness of 5 Å to 100 Å. Another aspect includes the ALD oxide layer having a thickness of 5 Å to 100 Å. Other aspects include the top portion of the plurality of Si fins is thinner than the bottom portion of the plurality of Si fins. A further aspect includes the top portion of the plurality of Si fins having a CD of 4 nanometer (nm) to 12 nm and the bottom portion of the plurality of Si fins having a CD of 5 nm to 15 nm. Additional aspects include the plurality of Si fins having a CD of 5 nm to 15 nm at the interface point of the bottom portion of the plurality of Si fins and the top portion of the plurality of Si fins.

A further aspect of the present disclosure is a method including: forming a plurality of Si fins on a Si substrate; forming a dielectric layer over the plurality of Si fins and the Si substrate; recessing the dielectric layer, exposing a top portion of the plurality of Si fins; thermally oxidizing surface of the top portion of the plurality of Si fins, an oxide layer formed to a thickness of 5 Å to 100 Å; and forming an ALD oxide layer over the oxide layer to a thickness of 5 Å to 100 Å by a remote oxygen plasma process at a temperature of 400° C. to 425° C.

Aspects of the present disclosure include performing a plasma oxidation process using a RF or a microwave plasma at a room temperature to up to 450° C.; and performing a plasma nitridation process subsequent to forming the ALD oxide layer. Another aspect includes performing a plasma nitridation process using a RF or a microwave plasma at a room temperature to up to 450° C. subsequent to forming the ALD oxide layer. A further aspect includes performing a $N_2O$/He or similar inert carry gases based high temperature annealing; and performing a plasma nitridation process and/or a high temperature anneal at a temperature of 600° C. to 1100° C. subsequent to forming the ALD oxide layer.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

The present disclosure addresses and solves the current problems of bigger fin CDs, bulging of the CD of Si fins and thinner oxide footing attendant upon forming Si fins from ISSG oxidation. The problem is solved, inter alia, by thermally oxidizing a Si fin to form an oxide layer over the Si fin and then forming an ALD oxide layer over the oxide layer.

Methodology in accordance with embodiments of the present disclosure includes forming a plurality of Si fins on a Si substrate. A dielectric layer is formed over the plurality of Si fins and the Si substrate. The dielectric layer is recessed, exposing a top portion of the plurality of Si fins. The surface of the top portion of the plurality of Si fins is thermally oxidized, an oxide layer formed; and an ALD oxide layer is formed over the oxide layer.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

Figure 1:
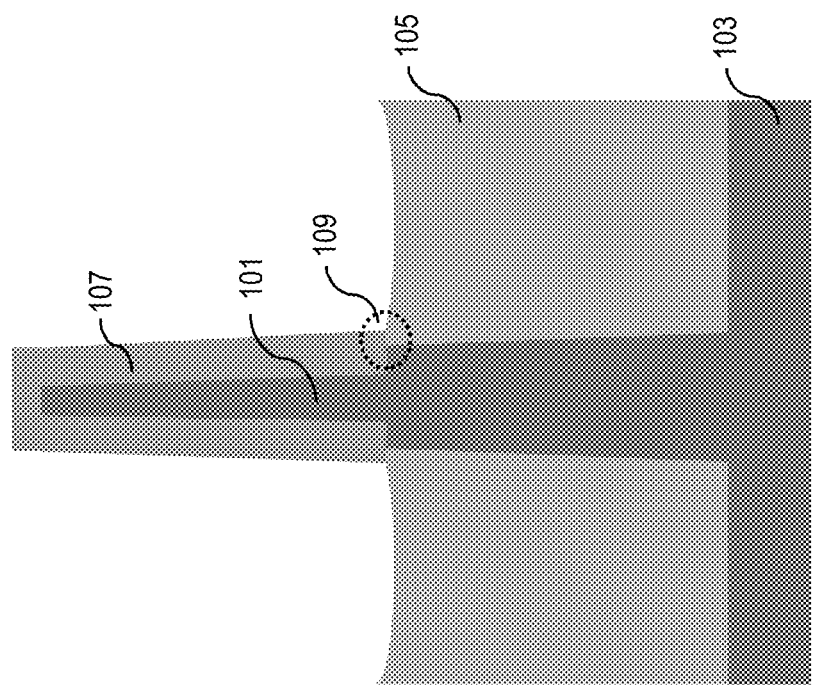
FIG. 1 illustrates a background Si fin during an ISSG oxidation.
Figure 2:
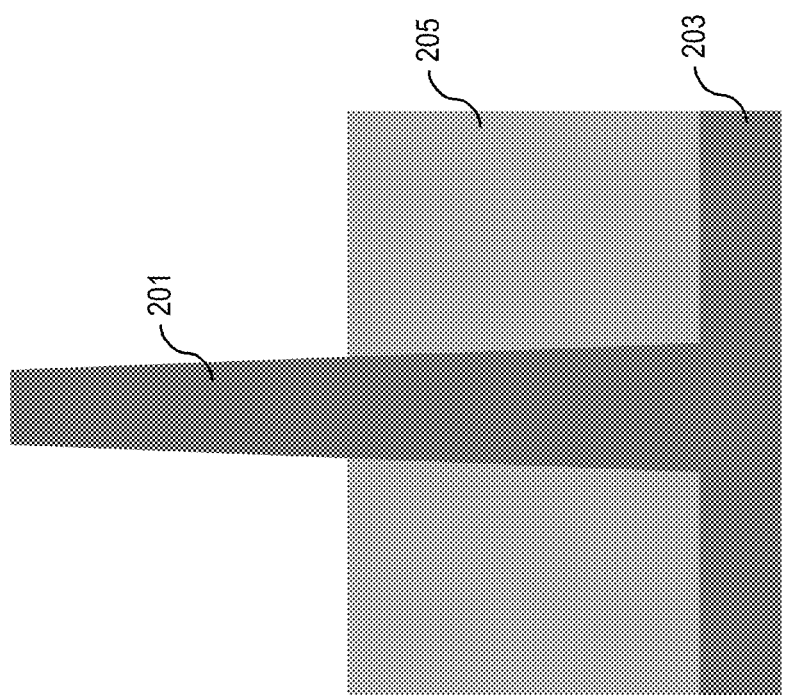
FIGS. 2 through 4 schematically illustrate cross-sectional views of a process flow for thermally oxidizing a Si fin to form an oxide layer over the Si fin and then forming an ALD oxide layer over the oxide layer, in accordance with an exemplary embodiment.
Figure 3:
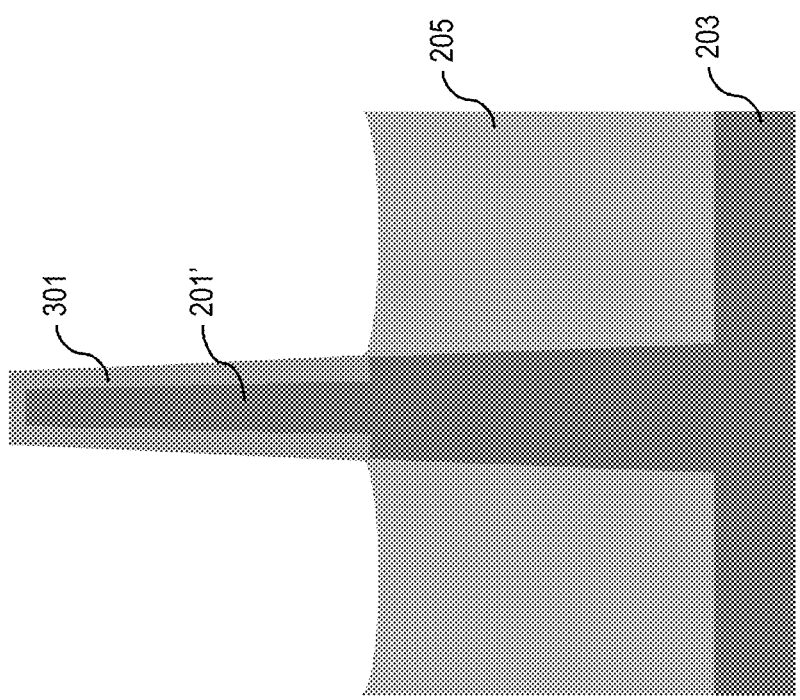
Figure 4:
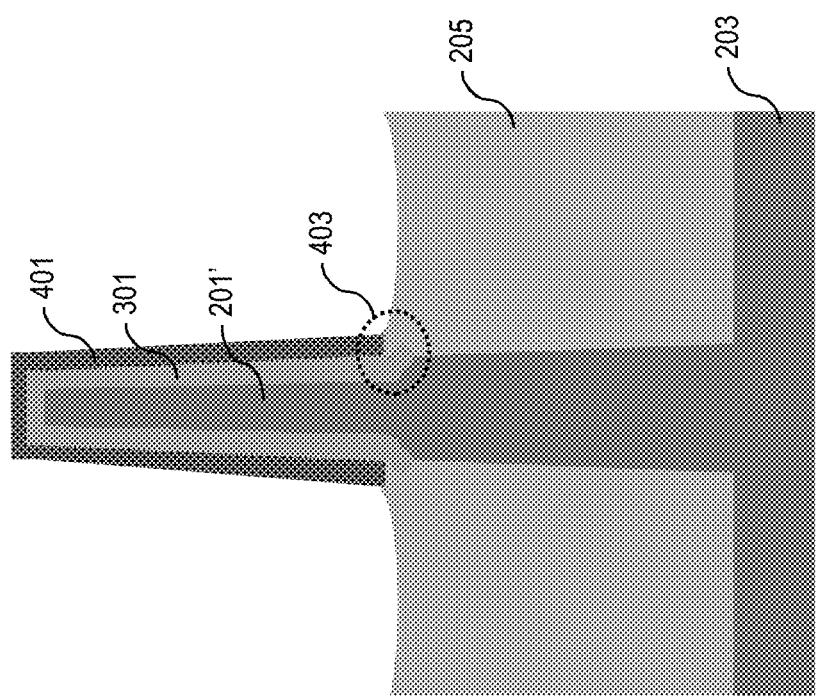

FIGS. 2 through 4 schematically illustrates cross-sectional views of a process flow for thermally oxidizing a Si fin to form an oxide layer over the Si fin and then forming an ALD oxide layer over the oxide layer, in accordance with an exemplary embodiment. Referring to FIG. 2, a Si fin 201 (representing one of a plurality) is formed on a Si substrate 203. Next, a dielectric layer (not shown for illustrative convenience) is formed over the Si fin 201 and the Si substrate 203. Subsequently, the dielectric layer is recessed, thereby exposing a top portion of the Si fin 201 above the remaining dielectric layer 205. As illustrated in FIG. 3, the surface of the top portion of the Si fin 201 is thermally oxidized, thereby forming an oxide layer 301, e.g., to a thickness of 5 Å to 100 Å, and the Si fin 201'. As a result of the thermal oxidation, the top portion of the Si fin 201' may have a CD, e.g., of 4 nm to 12 nm, and the bottom portion may have a CD, e.g., of 5 nm to 15 nm. In particular, the top portion of the Si fin 201' is thinner than the bottom portion of the Si fin 201'.

Referring to FIG. 4, an ALD oxide layer 401 is formed, e.g., to a thickness of 5 Å to 100 Å, over the oxide layer 301 by a remote oxygen plasma process. The remote oxygen plasma process is performed, e.g., at a temperature of 400° C. to 425° C. In one instance, subsequent to forming the ALD oxide layer 401, a plasma oxidation process is performed, e.g., using oxygen (O) or a mixture of O and He, using RF or microwave plasma at a room temperature to up to 450° C. for ALD oxide densification. Then, a plasma nitridation process is performed. In another instance, subsequent to forming the ALD oxide layer 401, a plasma nitridation process is performed using RF, e.g., decoupled plasma nitridation, or microwave plasma at a room temperature to up to 450° C. In a further instance, subsequent to forming the ALD oxide layer 401, a $N_2O$/He or similar inert carry gases based high temperature annealing is performed, e.g., at a temperature of 600° C. to 1100° C. for a period of 10 seconds to 120 seconds. Then, a plasma nitridation process and/or a high temperature annealing is performed. In one instance, a plasma nitridation process is performed on the oxide layer 301 and the ALD oxide layer 401, thereby providing an atomic percentage, e.g., 9% to 20%, of nitrogen (N). Then, the oxide layer 301 and the ALD oxide layer 401 are annealed, e.g., at a temperature of 600° C. to 1100° C. for a period of 10 seconds to 120 seconds. In another instance, the Si fin 201' has a CD of 5 nm to 15 nm at the interface point between the bottom portion of the Si fin 201' and the top portion of the Si fin 201', as highlighted by the circle 403.

Figure 5:
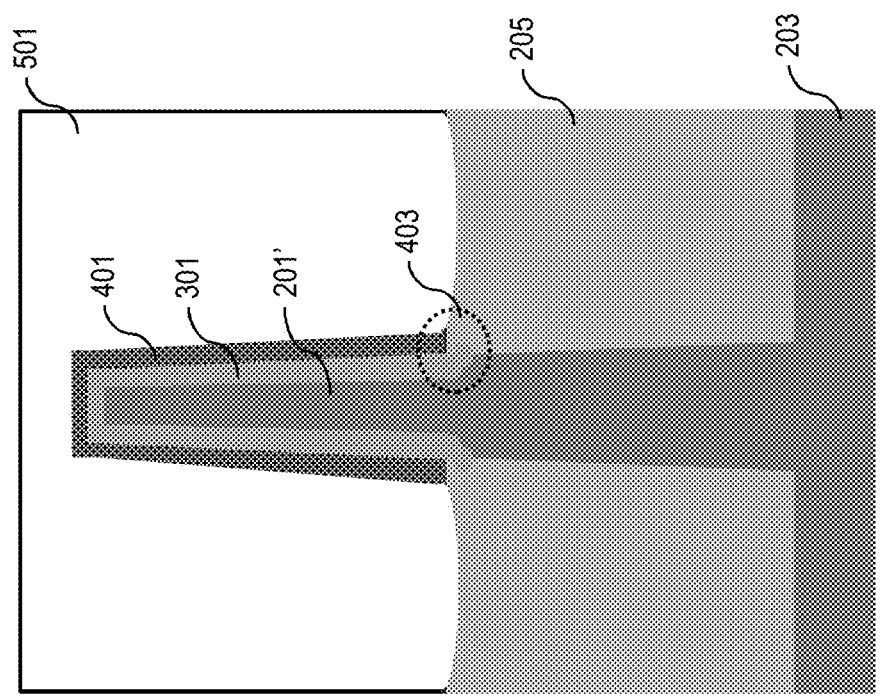
FIG. 5 illustrates a cross-sectional view of a process for forming a gate over the ALD oxide layer, in accordance with an exemplary embodiment.

FIG. 5 illustrates a cross-sectional view of a process for forming a gate over the ALD oxide layer, in accordance with an exemplary embodiment. Referring to FIG. 5, an amorphous silicon (aSi) or a polycrystalline Si layer (not shown for illustrative convenience) is formed, e.g., to a thickness of 150 nm to 300 nm, over the Si substrate 203. Then, the aSi or polycrystalline Si layer is patterned by a known process forming a dummy gate 501. Thereafter, the dummy gate 501 is removed. Next, a replacement metal gate (RMG) is formed (not shown for illustrative convenience). Additional RMG manufacturing follows using conventional processing steps.

The embodiments of the present disclosure can achieve several technical effects, such as a reduction in bulging of the CD of Si fins, a thicker EG oxide at the foot of Si fins, a better Si/oxide interface and an improved device leakage and reliability, e.g., negative-bias temperature instability (NBTI). In addition, the present disclosure results in a more uniform thickness of the EG oxide over and on the sidewall of the Si fins. Further, a reduction in bulging of the CD of Si fins and the hybrid EG oxide improves effective capacitance ($C_{eff}$) of the resultant device. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure enjoys industrial applicability in any of various types of highly integrated finFET semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
   forming a plurality of silicon (Si) fins on a Si substrate;
   forming a dielectric layer over the plurality of Si fins and the Si substrate;
   recessing the dielectric layer, exposing a top portion of the plurality of Si fins;
   thermally oxidizing surface of the top portion of the plurality of Si fins, an oxide layer formed;
   forming an atomic layer deposition (ALD) oxide layer over the oxide layer;
   after forming the ALD oxide layer, performing a plasma oxidation process using a radio frequency (RF) or a microwave plasma at a room temperature to up to 450° C.; and
   performing a plasma nitridation process subsequent to forming the ALD oxide layer and subsequent to the plasma oxidation process.

2. The method according to claim 1, comprising forming the oxide layer to a thickness of 5 angstrom (Å) to 100 Å.

3. The method according to claim 1, comprising forming the ALD oxide layer by a remote oxygen plasma process.

4. The method according to claim 1, comprising forming the ALD oxide layer to a thickness of 5 Å to 100 Å.

5. The method according to claim 1, further comprising performing a plasma nitridation process using a RF or a microwave plasma at a room temperature to up to 450° C. subsequent to forming the ALD oxide layer.

6. The method according to claim 1, further comprising:
   performing a nitrous oxide ($N_2O$)/helium (He) or similar inert carry gases based high temperature annealing; and
   performing a plasma nitridation process and/or a high temperature anneal subsequent to forming the ALD oxide layer.

7. The method according to claim 1, further comprising:
   performing a plasma nitridation process on the oxide layer and the ALD oxide layer; and
   annealing the oxide layer and the ALD oxide layer at a temperature of 600° C. to 1100° C.

8. The method according to claim 3, wherein the remote oxygen plasma process is performed at a temperature of 400° C. to 425° C.

9. The method according to claim 6, comprising performing the high temperature annealing at a temperature of 600° C. to 1100° C.

10. A device comprising:
    a plurality of silicon (Si) fins having a top portion and a bottom portion on a Si substrate;
    a dielectric layer over the Si substrate and along sidewalls of the bottom portion of the plurality of Si fins;
    an oxide layer over and along sidewalls of the top portion of the plurality of Si fins; and
    an atomic layer deposition (ALD) oxide layer over the oxide layer.

11. The device according to claim 10, wherein the oxide layer has a thickness of 5 angstrom (Å) to 100 Å.

12. The device according to claim 10, wherein the ALD oxide layer has a thickness of 5 Å to 100 Å.

13. The device according to claim 10, wherein the top portion of the plurality of Si fins is thinner than the bottom portion of the plurality of Si fins.

14. The device according to claim 10, wherein the plurality of silicon (Si) fins have a critical dimension (CD) of 5 nm to 15 nm at the interface point of the bottom portion of the plurality of Si fins and the top portion of the plurality of Si fins.

15. The device according to claim 13, wherein the top portion of the plurality of Si fins has a critical dimension (CD) of 4 nanometer (nm) to 12 nm and the bottom portion of the plurality of Si fins has a CD of 5 nm to 15 nm.

16. A method comprising:
    forming a plurality of silicon (Si) fins on a Si substrate;
    forming a dielectric layer over the plurality of Si fins and the Si substrate;
    recessing the dielectric layer, exposing a top portion of the plurality of Si fins;
    thermally oxidizing surface of the top portion of the plurality of Si fins, an oxide layer formed to a thickness of 5 angstrom (Å) to 100 Å;
    forming an atomic layer deposition (ALD) oxide layer over the oxide layer to a thickness of 5 Å to 100 Å by a remote oxygen plasma process at a temperature of 400° C. to 425° C.;
    after forming the ALD oxide layer, performing a plasma oxidation process using a radio frequency (RF) or a microwave plasma at a room temperature to up to 450° C.; and
    performing a plasma nitridation process subsequent to forming the ALD oxide layer and subsequent to the plasma oxidation process.

17. The method according to claim 16, further comprising performing a plasma nitridation process using a RF or a microwave plasma at a room temperature to up to 450° C. subsequent to forming the ALD oxide layer.

18. The method according to claim 16, further comprising:
    performing a nitrous oxide ($N_2O$)/helium (He) or similar inert carry gases based high temperature annealing; and
    performing a plasma nitridation process and/or a high temperature anneal at a temperature of 600° C. to 1100° C. subsequent to forming the ALD oxide layer.

* * * * *